US009935762B2

United States Patent
Bunce (10) Patent No.: US 9,935,762 B2
(45) Date of Patent: Apr. 3, 2018

(54) APPARATUS AND METHOD FOR CENTERING CLOCK SIGNAL IN CUMULATIVE DATA EYE OF PARALLEL DATA IN CLOCK FORWARDED LINKS

(71) Applicant: QUALCOMM Incorporated, San Diego, CA (US)

(72) Inventor: Robert Michael Bunce, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/214,296

(22) Filed: Jul. 19, 2016

(65) Prior Publication Data
US 2018/0026779 A1    Jan. 25, 2018

(51) Int. Cl.
*H04L 7/00*      (2006.01)
*H03L 7/08*      (2006.01)
*H04L 1/00*      (2006.01)

(52) U.S. Cl.
CPC .......... *H04L 7/0037* (2013.01); *H03L 7/0807* (2013.01); *H04L 1/0042* (2013.01); *H04L 7/0012* (2013.01)

(58) Field of Classification Search
CPC ....... H03L 7/0814; H03L 7/0812; H03L 7/00; G06F 1/10; G06F 13/1689; G06F 1/04; G11C 7/222; G11C 11/4076; G11C 2207/2254; H03K 2005/00019; H03K 5/135; H03K 2005/00058; H03K 5/159;
(Continued)

(56) References Cited

U.S. PATENT DOCUMENTS 5,729,550 A *  3/1998  Nakajima .................. G06F 5/06
                                                    370/241
6,876,186 B1 *  4/2005  Gupta ............... G01R 31/31725
                                                    324/76.52
(Continued)

FOREIGN PATENT DOCUMENTS

WO    WO-2011139503 A1    11/2011

OTHER PUBLICATIONS

Chen S., et al., "A Robust Energy/Area-Efficient Forwarded-Clock Receiver with All-Digital Clock and Data Recovery in 28-nm CMOS for High-Density Interconnects," IEEE Transactions on Very Large Scale Integration (VLSI) Systems, Feb. 2016, vol. 24 (2), pp. 578-586.

(Continued)

*Primary Examiner* — Khanh C Tran
(74) *Attorney, Agent, or Firm* — Loza & Loza, LLP/Qualcomm (57) ABSTRACT

An apparatus for setting the timing of a triggering edge of a clock signal with respect to received parallel data. The apparatus includes a set of flip-flops including respective data inputs, respective clock inputs, and respective data outputs, wherein the set of flip-flops are configured to generate a set of output data at the data output based on parallel data applied to the respective data inputs in response to a triggering edge of a clock signal applied to the clock inputs; a variable delay element configured to apply a calibrated delay to the clock signal; and a controller configured to generate a control signal for the variable delay element to apply the calibrated delay to the clock signal based on the set of output data generated at the data outputs of the set of flip-flops.

23 Claims, 9 Drawing Sheets

(58) Field of Classification Search
CPC .............. H03K 19/17716; G09G 5/008; H04L 25/0262; H04L 25/242; H04L 7/0033; H04L 7/0037; H04L 2012/5674; H04L 7/0008

See application file for complete search history.

(56) References Cited

U.S. PATENT DOCUMENTS

| | | | |
|---|---|---|---|
| 7,688,925 | B2 | 3/2010 | Lee et al. |
| 7,869,525 | B2 | 1/2011 | MacRi et al. |
| 7,991,099 | B2 | 8/2011 | Xia et al. |
| 8,817,184 | B1 | 8/2014 | Amirkhany et al. |
| 9,698,967 | B2 * | 7/2017 | Tang ..................... H04L 7/0012 |
| 2002/0006177 | A1 | 1/2002 | Pickering et al. |
| 2002/0031016 | A1 * | 3/2002 | Sato ..................... G11C 7/1006 365/198 |
| 2003/0026367 | A1 * | 2/2003 | Denny ................. H03L 7/0812 375/354 |
| 2003/0043926 | A1 * | 3/2003 | Terashima ........... H04L 7/0012 375/257 |
| 2004/0209635 | A1 * | 10/2004 | Hsu ....................... H04W 52/20 455/522 |
| 2007/0127404 | A1 * | 6/2007 | Best ......................... H04J 3/02 370/314 |
| 2008/0122507 | A1 * | 5/2008 | Fan ......................... H03L 7/07 327/158 |
| 2008/0303544 | A1 * | 12/2008 | Kawamura ............ G04F 10/00 326/16 |
| 2010/0315142 | A1 | 12/2010 | Zerbe |
| 2011/0187433 | A1 * | 8/2011 | Baumann ............... H03K 5/135 327/276 |
| 2012/0200330 | A1 * | 8/2012 | Kawagoe .............. H03K 5/133 327/161 |
| 2012/0294401 | A1 * | 11/2012 | Lin ....................... H04L 7/0041 375/362 |

OTHER PUBLICATIONS

International Search Report and Written Opinion—PCT/US2017/039654—ISA/EPO—Oct. 2, 2017.

* cited by examiner

APPARATUS AND METHOD FOR CENTERING CLOCK SIGNAL IN CUMULATIVE DATA EYE OF PARALLEL DATA IN CLOCK FORWARDED LINKS

BACKGROUND

Field

Aspects of the present disclosure relate generally to transmission of parallel data along with an associated clock signal (also referred to in the relevant art as a clock forwarded link), and in particular, to an apparatus and method for centering a triggering edge of a clock signal in a cumulative data eye of parallel data in clock forwarded links.

Background

A clock forwarded link or digital interface includes a transmitting device sending parallel data and a clock signal to a receiving device. The transmitted clock signal is the same clock signal used to launch the parallel data via a set of transmitting flip-flops from the transmitting device.

At the receiving device, a set of receiving flip-flops are used to receive or clock in the parallel data. The clock signal transmitted from the transmitting device to the receiving device is used at the receiving device to clock the flip-flops for receiving the parallel data.

In order for the parallel data to be accurately received, the triggering edge of the clock signal at the clock inputs of the receiving flip-flops should be properly set with respect to the parallel data at the respective data inputs of the flip-flops. More specifically, the triggering edge of the clock signal should be set substantially in the center of a valid data region (e.g., a continuous region of a logic one or logic zero) to optimize the setup and hold times. This ensures that the data will be properly received even though there is some timing jitter between the clock and data signals.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a set of flip-flops having data inputs, clock inputs, and data outputs, respectively, wherein the set of flip-flops are configured to generate a set of output data at the data outputs based on a set of parallel data applied to the data inputs in response to a triggering edge of a clock signal applied to the clock inputs, respectively; a variable delay element configured to apply a calibrated delay to the clock signal; and a controller configured to generate a control signal for the variable delay element to apply the calibrated delay to the clock signal based on the set of output data generated at the data outputs of the flip-flops, respectively.

Another aspect of the disclosure relates to a method including receiving a set of parallel data at respective data inputs of a set of flip-flops; receiving a clock signal at respective clock inputs of the set of flip-flops; generating a set of output data at respective data outputs of the set of flip-flops in response to a triggering edge of the clock signal; and setting a timing of the triggering edge of the clock signal with respect to the parallel data based on the output data.

Another aspect of the disclosure relates to an apparatus including means for receiving a set of parallel data at respective data inputs of a set of flip-flops; means for receiving a clock signal at respective clock inputs of the set of flip-flops; means for generating a set of output data at respective data outputs of the set of flip-flops in response to a triggering edge of the clock signal; and means for setting a timing of the triggering edge of the clock signal with respect to the parallel data based on the output data.

Another aspect of the disclosure relates to an apparatus including a flip-flop having a data input, a clock input, and a data output, wherein the flip-flop is configured to generate an output data at the data output based on an input data applied to the data input in response to a triggering edge of a clock signal applied to the clock input; a variable delay element configured to apply a calibrated delay to the input data; and a controller configured to generate a control signal for the variable delay element to apply the calibrated delay to the input data based on the output data generated at the data output of the flip-flop.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

High speed digital interfaces sometime include the transmission of parallel data between a transmitting device and a receiving device launched or clocked out at the transmitting device by a common clock signal generated by a source clock. Some of these interfaces include clock and data recovery (CDR) circuit at the receiving device to receive one of the parallel data, and generate a clock signal therefrom. The generated clock signal is then used to receive or clock in the parallel data at the receiving device. However, such CDR circuit is often undesirable because it consumes substantial amount of power and requires complex circuitry.

Another type of high speed digital interface is referred to as a clock forwarded digital interface (also known as a source synchronous interface). In a clock forwarded interface, the clock signal used to launch the parallel data from the transmitting device to the receiving device is also sent from the transmitting device to the receiving device. The clock signal received by the receiving device is used to receive or clock in the parallel data.

Since the parallel data paths or lanes can be designed to be substantially identical to each other, the skew between the parallel data may be managed to within a certain tolerance. However, because the clock signal path or lane is usually different than the data lanes (e.g., the clock signal does not go through flip-flops, and may be configured as a differential signal to reduce noise), there could be a significant skew between the received clock signal and the received parallel data.

Accordingly, in previous designs of clock forwarded digital interfaces, a clock tree is employed at the receiving device to apply a certain fixed delay to the received clock signal to substantially center a triggering edge of the clock signal (e.g., the rising edge of the clock signal) between transitions of the data or at the center of the data eye. The clock tree typically includes fixed (predetermined) delays in the form of buffers and other delay elements to set the phase of the clock signal to substantially optimize the setup and hold time margins for the receiving flip-flops.

However, due to aging, temperature variation, and process variation, the fixed delay of the clock tree may drift, causing the triggering edge of the clock signal to deviate from the center of the data eye. This limits the data rate at which the parallel data may be transmitted because generally the higher data rates result in a smaller data eye. Thus, to ensure that the clock edge is maintained in a valid data region (e.g., a region of continuous logic ones (1s) or continuous logic zeros (0s)), the maximum data rate has to be set such that the triggering edge of the clock signal does not drift into the transition region of the data eye.

In summary, a receiving device includes a clock phase adjustment circuit configured to set a triggering edge (e.g., a rising edge) of a received clock signal at the clock inputs of the receiving flip-flops at substantially a center of a valid data region of the collective parallel data at the data inputs of the receiving flip-flops. The clock phase adjustment circuit is configured to set the triggering edge of the received clock signal based on samples of data outputted by the receiving flip-flops pertaining to the parallel data lanes, respectively. For clock phase adjustment purposes, the samples of data may be a certain test pattern, such as alternating ones and zeros (e.g., 1010 . . . ). The following describes various implementations of such clock phase adjustment circuit and related circuitry.

Figure 1:
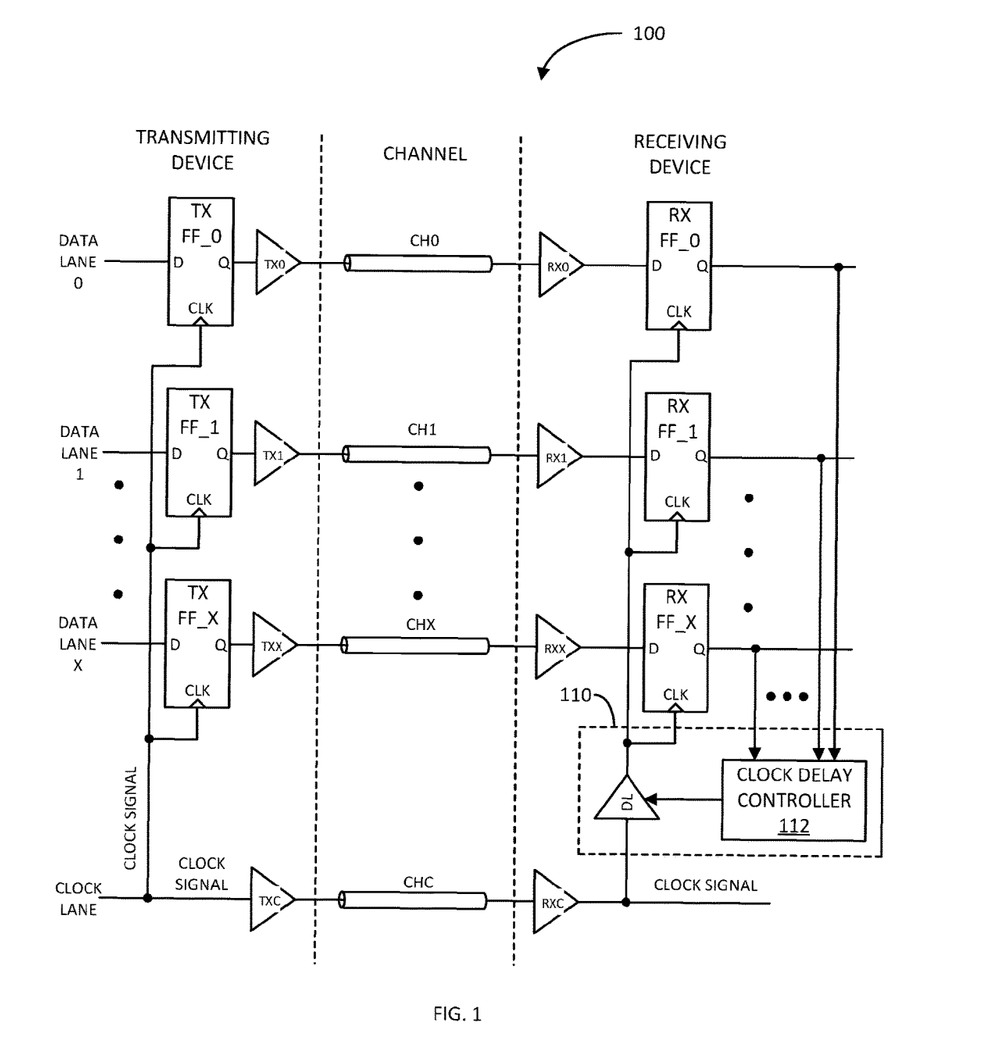
FIG. 1 illustrates a block diagram of an exemplary clock forwarded digital interface (also known as a source synchronous digital interface) in accordance with an aspect of the disclosure.

FIG. 1 illustrates a schematic diagram of an exemplary clock forwarded digital interface 100 in accordance with an aspect of the disclosure. The digital interface 100 includes a transmitting device, a channel, and a receiving device.

The transmitting device includes a set of transmitting flip-flops TX FF_0, TX FF_1 to TX_X including respective data inputs (D) for receiving data corresponding to a set of parallel data lanes 0, 1 to X, respectively. The set of transmitting flip-flops TX FF_0, TX FF_1 to TX_X include clock inputs (CLK) for receiving a clock signal for launching the parallel data for transmission to the receiving device. The transmitting device also includes a set of transmit amplifiers TX0, TX1 to TXX for transmitting the parallel data, generated at the data outputs (Q) of the transmitting flip-flops TX FF_0, TX FF_1 to TX_X, from the transmitting device to the receiving device via a set of transmission channels CH0, CH1 to CHX (e.g., metallization traces on a printed circuit board (PCB)), respectively.

The receiving device includes a set of receiving flip-flops RX FF_0, RX FF_1 to RX_X including respective data inputs (D) for receiving the parallel data corresponding to the set of parallel data lanes 0, 1 to X, respectively. The set of receiving flip-flops RX RX FF_1 to RX_X receive the parallel data via a set of receive amplifiers RX0, RX1 to RXX, respectively. The set of receiving flip-flops RX FF_0, RX FF_1 to RX_X include respective clock inputs (CLK) configured to receive a clock signal for clocking in the parallel data received from the transmitting device via the channels CH0, CH1 to CHX, respectively. The set of receiving flip-flops RX FF_0, RX FF_1 to RX_X generate the received parallel data at respective data outputs (Q).

The transmitting device includes a transmit amplifier TXC for transmitting the clock signal (e.g., that is used to clock the transmitting flip-flops TX FF_0, TX FF_1 to TX_X) to the receiving device via a corresponding channel CHC. The receiving device includes a receive amplifier RXC for receiving the clock signal from the transmitting device via the channel CHC.

The receiving device further includes a clock phase adjustment circuit 110 configured to substantially center a triggering edge (e.g., rising edge) of the clock signal (received from the transmitting device) at a center of a collective data eye or valid data region of the parallel data at the data inputs (D) of the receiving flip-flops RX FF_0, RX FF_1 to RX_X. The clock phase adjustment circuit includes a clock delay controller 112 configured to receive samples of data outputted by the receiving flip-flops RX FF_0, RX FF_1 to RX_X. The clock phase adjustment circuit 110 further includes a variable delay element DL including a clock input configured to receive the received clock signal, a control input configured to receive a control signal generated by the delay controller 112 for applying a particular delay to the clock signal, and an output configured to produce the delayed clock signal. The delayed clock signal is applied to the respective clock inputs (CLK) of the receiving flip-flops RX FF_0, RX FF_1 to RX_X.

Figure 2:
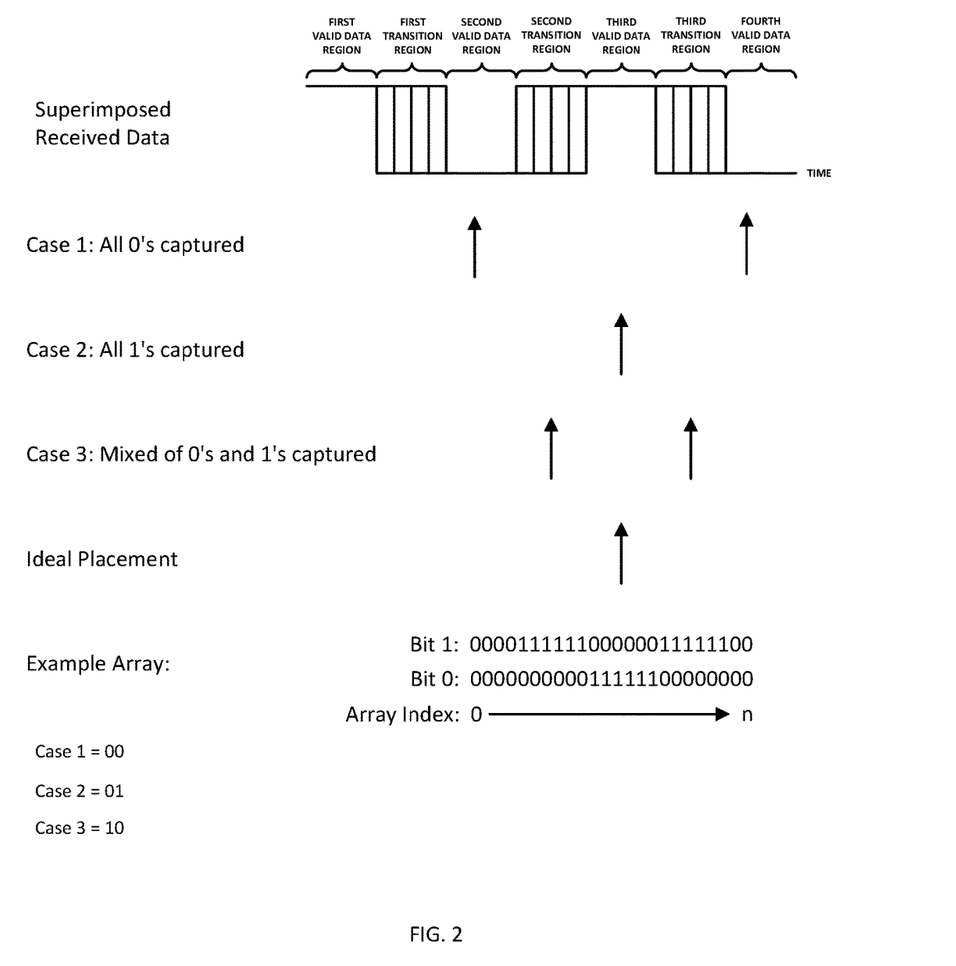
FIG. 2 illustrates a diagram for an explanation of an exemplary method employed by a clock phase adjustment circuit for centering a triggering edge of a received clock signal at substantially the center of a valid data region of the collective parallel data in accordance with another aspect of the disclosure.

FIG. 2 illustrates a diagram for explaining an exemplary method employed by the clock phase adjustment circuit 110 for centering a triggering edge of the received clock signal at the clock inputs (CLK) of the receiving flip-flops RX FF_0 to RX_X at substantially the center of a valid data region of the collective parallel data at the data inputs (D) of the flip-flops RX FF_0 to RX_X. In other words, the triggering edge of the clock signal arrives at the clock inputs (CLK) of the receiving flip-flops when the center of the largest valid data region is applied to the data inputs (D) of the receiving flip-flops.

A top portion of the timing diagram depicts the received parallel data at the data inputs (D) of the receiving flip-flops RX FF_0 to RX_X superimposed on top of each other. From left-to-right, the superimposed received parallel data includes a first valid data region where all of the received data samples at the data outputs (Q) of the receiving flip-flops RX FF_0 to RX_X are at a logic one (1) level.

To the right of the first valid data region, the superimposed received data includes a first transition region where the received data samples at the data outputs (Q) of the receiving flip-flops RX FF_0 to RX_X are transitioning from the logic one (1) level to a logic zero (0) level. As illustrated, due to some skew between the parallel data, the transitions do not occur at the same time.

To the right of the first transition region, the superimposed received data includes a second valid data region where all of the received data samples at the data outputs (Q) of the receiving flip-flops RX FF_0 to RX_X are at a logic zero (0) level. To the right of the second valid data region, the superimposed received data includes a second transition region where the received data samples at the data outputs (Q) of the receiving flip-flops RX FF_0 to RX_X are transitioning from the logic zero (0) level to the logic one (1) level.

To the right of the second transition region, the superimposed received data includes a third valid data region where all of the received data samples at the data outputs (Q) of the receiving flip-flops RX FF_0 to RX_X are at a logic one (1) level. To the right of the third valid data region, the superimposed received data includes a third transition region where the received data samples at the data outputs (Q) of the receiving flip-flops RX FF_0 to RX_X are transitioning from the logic one (1) level to the logic zero (0) level. To the right of the third transition region, the superimposed received data includes a fourth valid data region where all of the received data samples at the data outputs (Q) of the receiving flip-flops RX FF_0 to RX_X are at a logic zero (0) level.

The delay controller 112 controls the delay element DL to monotonically change (e.g., increment or decrement) the delay of the received clock signal n number of times, e.g., n=0 to 23. For each delay, the delay controller 112 receives samples of the parallel data from the data outputs (Q) of the receiving flip-flops RX FF_0 to RX_X.

As illustrated in the second (from-the-top) portion of the diagram in FIG. 2, if the delay controller 112 receives all zeros (0s) for the sampled data (because for that particular delay, the triggering edge of the clock signal at the clocks inputs (CLK) of the receiving flip-flops RX FF_0, RX FF_1 to RX_X coincides with a valid zero data region of the parallel data applied to the data inputs (D) of the receiving flip-flops), the delay controller 12 adds a certain value (e.g., a two-bit code) to an array, such as 00 (Bit 1=0, Bit 0=0).

As illustrated in the third (from-the-top) portion of the diagram in FIG. 2, if the delay controller 112 receives all ones (1s) for the sampled data (because for that particular delay, the triggering edge of the clock signal at the clock inputs (CLK) of the receiving flip-flops RX FF_0, RX FF_1 to RX_X coincides with a valid one data region of the parallel data applied to the data inputs (D) of the receiving flip-flops), the delay controller 112 adds another value (e.g., another two-bit code) to the array, such as 01 (Bit 1=0, Bit 0=1).

As illustrated in the fourth (from-the-top) portion of the diagram in FIG. 2, if the delay controller 112 receives a mixture of ones (1s) and zeros (0s) for the sampled data (because for that particular delay, the triggering edge of the clock signal at the clock inputs (CLK) of the receiving flip-flops RX FF_0, RX FF_1 to RX_X coincides with a transition region of the parallel data applied to the data inputs (D) of the receiving flip-flops), the delay controller 112 adds yet another value (e.g., yet another two-bit code) to the array, such as 10 (Bit 1=1, Bit 0=0).

Accordingly, for a sweep of n delays, the delay controller 112 generates a two-bit array as shown in the sixth (from-the-top) portion of the diagram in FIG. 2. The set of values of the two-bit array corresponds to the set of monotonically changing delays of the clock signal. The delay controller 112 then analyzes the array to determine the largest valid data region and then generates the proper control signal for the variable delay element DL to set a timing of the triggering edge of the clock signal at the clock inputs (CLK) of the receiving flip-flops RX FF_0, RX FF_1 to RX_X to coincide with the center of the largest valid data region applied to the data inputs (D) of the receiving flip-flops.

As shown, the largest valid data region is the one that has six consecutive codes 01 indicating six consecutive delays where the captured sampled data were all logic ones (1s). The other "smaller" valid data regions are the four consecutive codes 00 indicating four consecutive delays where the captured sampled data were all logic zeros (0s), and the two consecutive codes 00 indicating two consecutive delays where the captured sampled data were at logic zeros (0s). As these were smaller than the six consecutive logic ones (1s), the delay controller 112 may not use these valid data regions in which to center the triggering edge of the clock signal.

In terms of the length of the delay sweep, the sweep may be at least one (1) unit interval (e.g., a bit time) if the start location of the sweep in terms of the data eye is known and properly selected. This ensures that the delay sweep is performed over a full valid data region. If the start location of the delay sweep is unknown, the sweep may be at least two (2) unit intervals. Again, this ensures that the delay sweep is performed over a full valid data region.

Figure 3:
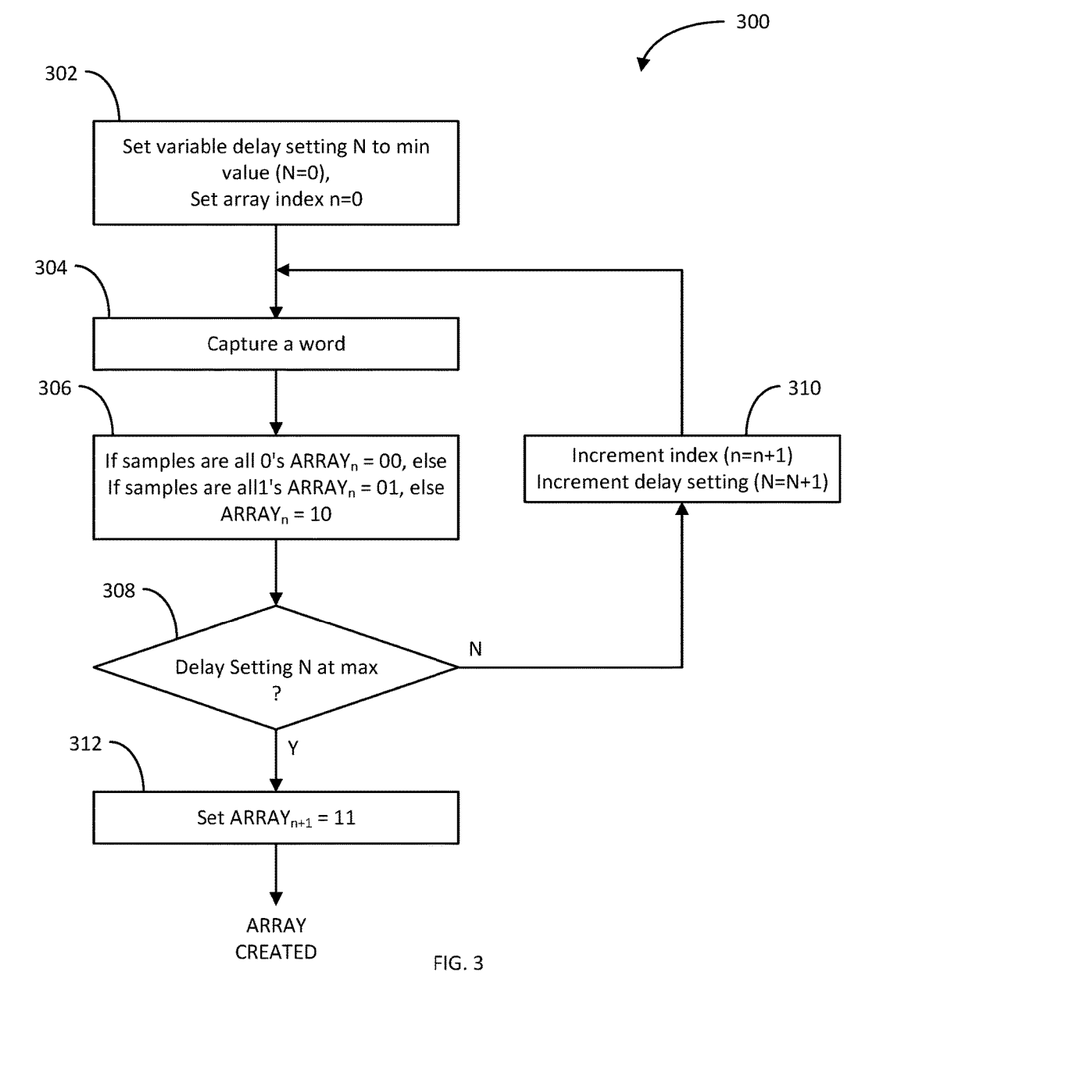
FIG. 3 illustrates a flow diagram of an exemplary method of generating an array used for centering a triggering edge of a received clock signal at substantially the center of a valid data region of the collective parallel data in accordance with another aspect of the disclosure.

FIG. 3 illustrates a flow diagram of an exemplary method 300 of generating a two-bit array in accordance with another aspect of the disclosure. The method 300 may be implemented by the delay controller 112. The method 300 includes setting the delay N of the variable delay element DL to an initial delay of zero (N=0) and setting an index n of the array to zero (0) (block 302). The method 300 further includes capturing a word of the parallel data from data outputs (Q) of the receiving flip-flops (block 304).

In block 306 of the method 300, if the captured word includes all logic zeros (0s), the delay controller 112 assigns the current index n of the array the value 00; if the captured word includes all logic ones (1s), the delay controller 112 assigns the current index n of the array the value 01; and if the captured word includes a mixture of logic ones (1s) and zeros (0s), the delay controller 112 assigns the current index n of the array the value 10.

In block 308 of the method 300, the delay controller 112 determines whether the current delay setting N is at the maximum delay for the sweep (block 308). If no, the method 300 proceeds to block 310 where the current array index n is incremented (n=n+1) and the current delay N is incremented (N=N+1) (block 310). The method 300 then proceeds back to block 304. If, on the other hand, in block 308 it is determined that the current delay setting N is at the maximum delay for the sweep, the method 300 proceeds to block 312, where the delay controller 112 appends an end value 11 to the array at index n+1. At such point, the delay controller 112 has created the array.

Figure 4:
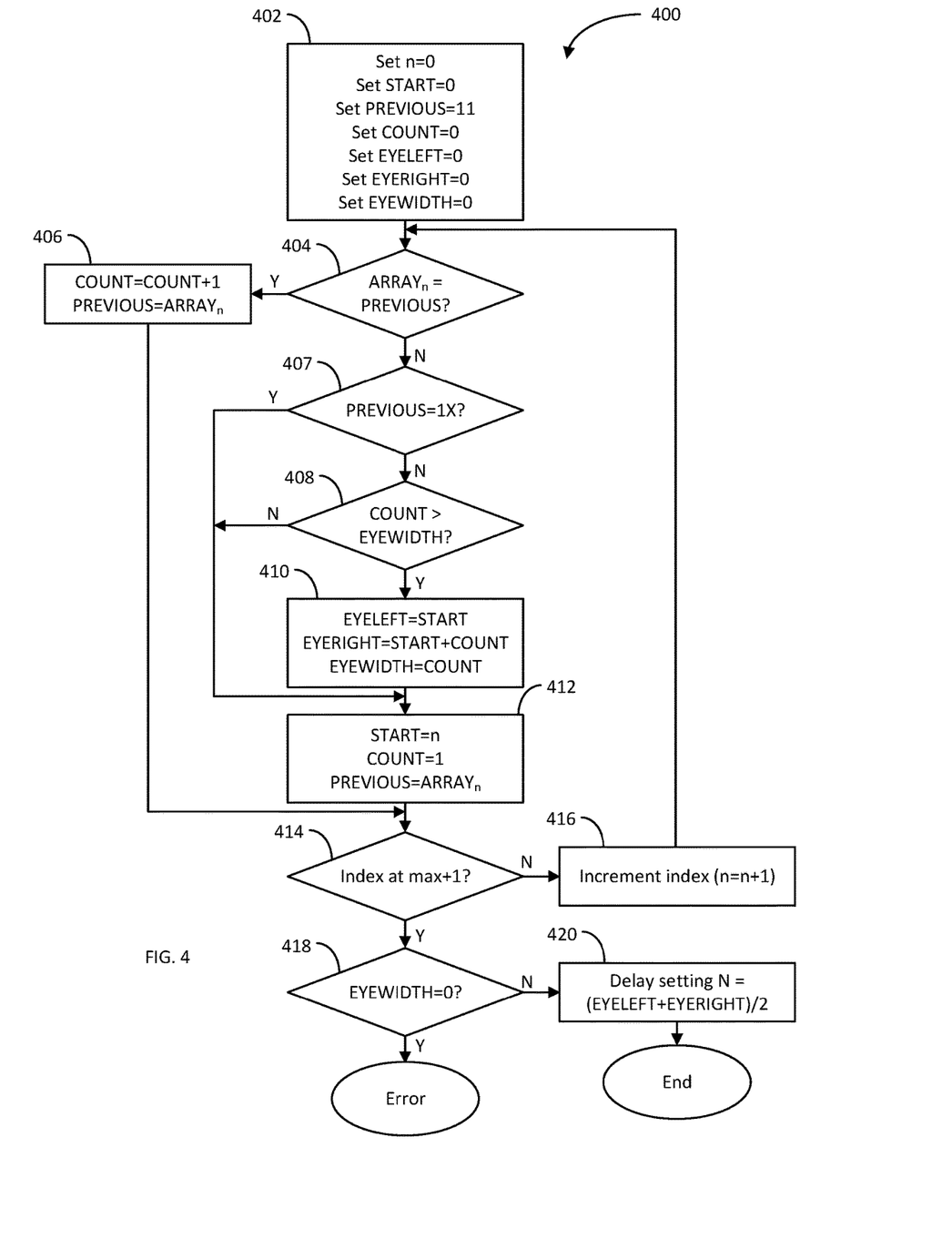
FIG. 4 illustrates a flow diagram of an exemplary method of centering a triggering edge of a received clock at substantially the center of a valid data region of the collective parallel data in accordance with another aspect of the disclosure.

FIG. 4 illustrates a flow diagram of an exemplary method 400 of determining the largest valid data region of the collective parallel data and setting the triggering edge of the clock signal to substantially coincide with the center of the largest valid data region in accordance with another aspect of the disclosure. The method 400 may be implemented by the delay controller 112. The method 400 may be implemented after the formation of the array in accordance with method 300 previously discussed.

According to the method 400, the delay controller 112, in block 402, initializes various variables as follows: n (index of the array) is initialized to zero (0); START (indicates the lowest array index of a current valid data region) is initialized to zero (0); PREVIOUS (indicates the array value corresponding to the previous (n−1) index of the array) is initialized to 11; COUNT (length of the current valid data region) is initialized to zero (0); EYELEFT (indicates the lowest array index of the current largest valid data region) is initialized to zero (0); EYERIGHT (indicates the highest array index of the current largest valid data region) is initialized to zero (0); and EYEWIDTH (indicates the width in array indices of the current largest valid data region) is initialized to zero (0).

Then, according to the method 400, the delay controller 112 determines whether the array value for the current index n $ARRAY_n$ is equal to the PREVIOUS value (block 404). Considering the array example shown in FIG. 2, the array value for the current index 0 is 00. The PREVIOUS variable is 11. Thus, according to the method 400, in block 404, the delay controller 112 determines that the current array value $ARRAY_0$ (00) is not equal to the PREVIOUS value (11). Accordingly, the delay controller 112 proceeds to perform an operation specified in block 406. Generally, the method 400 proceeds to block 406 when it first encounters block 404 as it is unlikely that the array value corresponding to the array index n=0 has a value of 11.

In block 406, according to the method 400, the delay controller 112 increments the COUNT by one (COUNT=COUNT+1) and sets the PREVIOUS variable to the current array value $ARRAY_n$. In this example, COUNT is equal to zero (0). Thus, after the operations specified in block 406, COUNT is equal to one (1). Also, in this example, PREVIOUS is equal to 11 and $ARRAY_0$ is equal to 00. Thus, after the operations specified in block 406, PREVIOUS is equal to 00.

Then, according to the method 400, the delay controller 112 determines whether the current array index n is at max+1, where max is equal to the number of indices in the array (block 414). If the current array index n is not at max+1, the delay controller 112 proceeds to perform an operation specified in block 416. If, on the other hand, the current array index n is at max+1, the delay controller 112 proceeds to perform an operation specified in block 414. In this example, since the current array index is 0 (0 being less than max+1), the delay controller 112 increments the current array index n (n=n+1) (block 416).

According to the method 400, the delay controller 112 then returns to block 404 to determine whether the current array value $ARRAY_n$ is equal to the PREVIOUS value (block 404). In this example, the current array value $ARRAY_1$ is equal to 00 and the PREVIOUS value is equal to 00. Thus, in this case, the delay controller 112 proceeds to perform an operation specified in block 407.

In summary, if the delay controller 112 proceeds to block 406, it means that the current array index n is within of a valid data region or a transition region since the current array value $ARRAY_n$ is equal to the PREVIOUS value. Considering the array example of FIG. 2, the current array index n is 1, 2, or 3, the current array index corresponds to the first valid data region consisting of consecutive four zeros (0s) at array indices 0 to 3.

If the delay controller 112 proceeds to block 407, it could mean a beginning of a valid data region or a transition region. For instance, considering the array example of FIG. 2, if the current index n is 4, the current array value $ARRAY_4$ is equal to 10 and the PREVIOUS value is equal to 00. In such case, it marks the beginning of the transition period denoted by the six consecutive 10 array values.

According to the method 400, in block 407, the delay controller 112 determines whether the PREVIOUS value is equal to 1X, where X could be a 0 or 1 (block 406). If the delay controller 112 determines that the PREVIOUS value is 1X, the delay controller proceeds to block 412. This may be the case where the current array index n is within a transition region. Or, this may also be the case where the current array index n is at max+1, and the PREVIOUS value is 11 indicating the end of the array.

If, in block 407, the delay controller 112 determines that the PREVIOUS value is not 1X, then the delay controller proceeds to block 408. This is the case where the current array index n is at an index immediately after a valid data region. Accordingly, the delay controller 112 determines whether the COUNT is greater than the EYEWIDTH (block 408). This operation is performed to determine whether the immediate previous valid data region as indicated by the variable COUNT is greater than the current maximum valid data region as indicated by the variable EYEWIDTH.

For instance, considering the array example of FIG. 2, at current array index 16, the COUNT is equal to 6 because of the immediate previous data region consists of six array values 01. The EYEWIDTH value is equal to 4 because the current maximum valid data region consists of four array values 00. Thus, in such case, the delay controller 112 determines that COUNT is greater than EYEWIDTH and proceeds to block 410. If, on the other hand, the delay controller 112 determines that the COUNT is not greater than EYEWIDTH, the delay controller 112 proceeds to block 412.

In block 412, according to the method 400, the delay controller 112 sets the START variable equal to the current array index n, sets the COUNT to one (1), and sets PREVIOUS to the current array value $ARRAY_n$. The operation specified in block 412 may indicate the beginning of a valid data region. Accordingly, setting the START to the current array index n is done to mark the beginning of the valid data region. Setting the COUNT to 1 is to initialize the length of the valid data region to 1. And, setting PREVIOUS to the current array value ARRAY$_n$ is done so that in block 404, the delay controller 112 may determine whether the next current array index n+1 is within a valid data region or transition region by answering in the affirmative in block 404 or whether it is at an ending of a valid data region or transition region by answering in the negative in block 404.

In block 410, according to the method 400, the delay controller 112 sets EYELEFT to START, sets EYERIGHT to START+COUNT, and sets EYEWIDTH to COUNT. The delay controller 112 performs this operation to keep track of the current maximum valid data region. The EYELEFT variable indicates the beginning in array index n of the current maximum valid data region. The EYERIGHT variable indicates the end in array index n of the current maximum valid data region. The EYEWIDTH variable indicates the width in array index n of the current maximum valid data region.

If, in block 418, according to the method 400, the delay controller 112 determines that the current array index n is at max+1, the delay controller determines whether EYEWIDTH is equal to zero (0) (block 418). If so, then the delay controller 112 determines that an error has occurred, and may reinitialize another array generation per method 400 and another method of determining the largest valid data region per method 500.

If, in block 418, according to the method 400, the delay controller 112 determines that EYEWIDTH is not zero (0), the delay controller calculates the delay setting N for the variable delay element DL. For instance, the delay controller 112 may determine the delay setting N for the delay element DL to set the triggering edge of the clock signal at the clock inputs (CLK) of the receiving flip-flops RX FF_0 to RX FF_X to coincide substantially with the center of the largest valid data region of the cumulative data signals applied to the data inputs (D) of the receiving flip-flops RX FF_0 to RX FF_X. For example, such delay setting N may be determined by the following equation:

$$N=(EYELEFT+EYERIGHT)/2$$

In summary, the variable EYELEFT indicates the delay that coincides with the left edge of the largest valid data region, the EYERIGHT indicates the delay that coincides with the right edge of the largest valid data region, and the EYEWIDTH indicates the width in delays of the largest valid data region. Block 420 is performed to determine the delay which results in the triggering edge of the clock signal coinciding with substantially the center of the largest valid data region. Block 408 is configured to discard valid data regions that are smaller than the largest valid data region.

Figure 5:
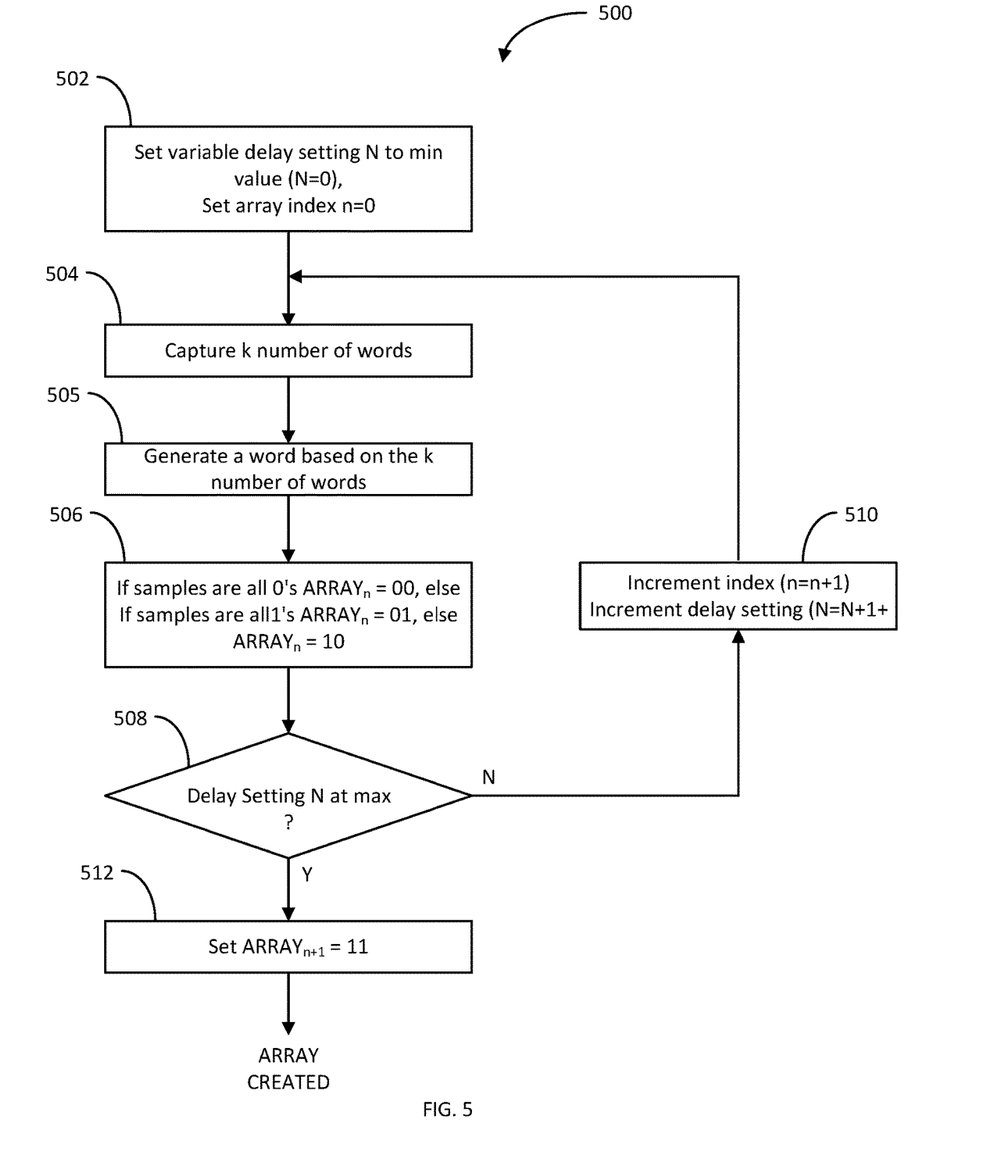
FIG. 5 illustrates a flow diagram of another exemplary method of generating an array for centering a triggering edge of a received clock signal at substantially the center of a valid data region of the collective parallel data in accordance with another aspect of the disclosure.

FIG. 5 illustrates a flow diagram of another exemplary method 500 of generating a two-bit array in accordance with another aspect of the disclosure. The method 500 is similar to that of method 400 and includes many of the same operations as indicated by the same reference numbers but with the most significant digit being a "5" instead of a "3". A difference between method 500 and method 300 is that for each delay setting, k (k>1) words are captured and a combined word is generated based on the k words. The assignment of the different values of the array is then based on the combined word. This may provide more accuracy of the data eye for the collective parallel data. Similarly, the method 500 may be implemented by the delay controller 112.

More specifically, the method 500 includes setting the delay N of the variable delay element DL to an initial delay of zero (N=0) and setting an index n of the array to zero (0) (block 502). The method 500 further includes capturing k number of words (k>1) of the parallel data from data outputs (Q) of the receiving flip-flops (block 504).

The method 500 further includes generating a word based on the k number of words (block 505). For example, the generated word may be an average of the k words, with the individual values of the generated word being rounded to a zero (0) or a one (1). As another example, if any of the k words is a mixed word, then the generated word may be the mixed words. In block 506 of the method 500, if the generated word includes all logic zeros (0s), the delay controller 112 assigns the current index n of the array the value 00; if the generated word includes all logic ones (1s), the delay controller 112 assigns the current index n of the array the value 01; and if the generated word includes a mixture of logic ones (1s) and zeros (0s), the delay controller 112 assigns the current index n of the array the value 10.

In block 508 of the method 500, the delay controller 112 determines whether the current delay setting N is at the maximum delay for the sweep (block 508). If no, the method 500 proceeds to block 510 where the current array index n is incremented (n=n+1) and the current delay N is incremented (N=N+1). The method 500 then proceeds back to block 504. If, on the other hand, in block 508 it is determined that the current delay setting N is at the maximum delay for the sweep, the method 500 proceeds to block 512, where the delay controller 112 appends an end value 11 to the array at index n+1. At such point, the delay controller 112 has created the array.

Figure 6:
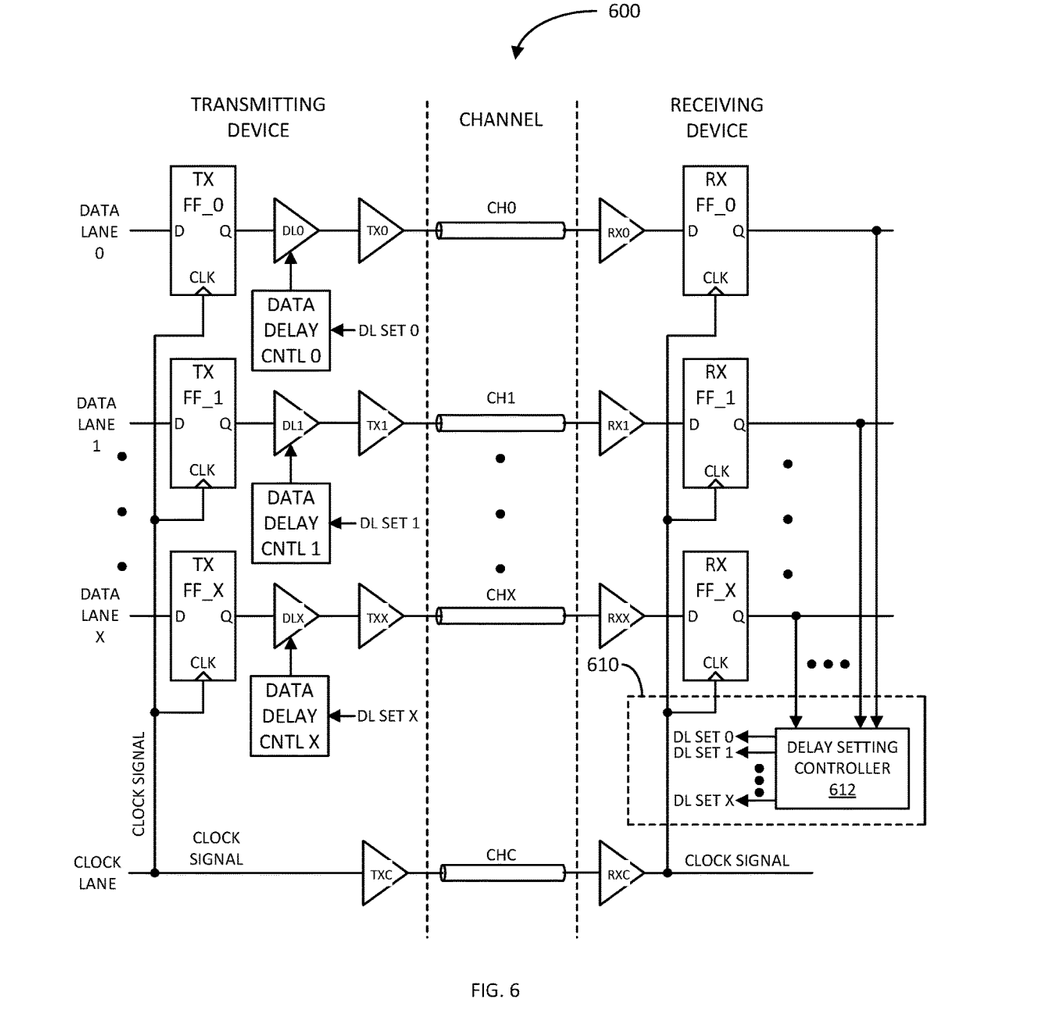
FIG. 6 illustrates a schematic diagram of another exemplary clock forwarded digital interface in accordance with another aspect of the disclosure.

FIG. 6 illustrates a schematic diagram of another clock forwarded digital interface 600 in accordance with another aspect of the disclosure. The digital interface 600 is similar to that of digital interface 100 and includes many of the same elements as indicated by the same reference identifiers. A difference between digital interface 600 and digital interface 100 is that the delay of each of the parallel data is swept by data delay controllers 0 to X at the transmitting device with respect to a fixed received clock signal at the receiving device. A delay setting controller 612 performs similar process to set a triggering edge of the clock signal at the clock input (CLK) of each of the receiving flip-flops to coincide with at the center of a valid data region of the parallel data at the data input (D) of each of the receiving flip-flops. The control signals DL SET 0 to DL SET X, which produce the centering of the triggering edge of the clock signal at the center of the respective valid data regions, is sent back to the data delay controllers 0 to X at the transmitting device.

In particular, the digital interface 600 includes a transmitting device, a channel, and a receiving device. The transmitting device includes a set of transmitting flip-flops TX FF_0, TX FF_1 to TX_X having respective data inputs (D) for receiving data corresponding to a set of parallel data lanes 0, 1 to X, respectively. The set of transmitting flip-flops TX FF_0, TX FF_1 to TX_X include respective clock inputs (CLK) for receiving a clock signal for launching the parallel data for transmission to the receiving device. The parallel data for transmission are generated at the respective data outputs (Q) of the transmitting flip-flops TX FF_0, TX FF_1 to TX_X.

The transmitting device also includes a set of variable delay elements DL0, DL1 to DLX for delaying the parallel data generated at the data outputs (Q) of the transmitting flip-flops TX FF_0, TX FF_1 to TX FF_X, respectively. The amount of delay of the parallel data provided by the variable delay elements DL0, DL1 to DLX is controlled by data delay controllers 0, 1 to X based on control signals DL SET 0, DL SET 1 to DL SET X, respectively. The transmitting device further includes a set of transmit amplifiers TX0 to TXX for transmitting the delayed parallel data from the transmitting device to the receiving device via a set of transmission channels CH0, CH1 to CHX (e.g., metallization traces on a printed circuit board (PCB)).

The receiving device includes a set of receiving flip-flops RX FF_0, RX FF_1 to RX_X having respective data inputs (D) for receiving the parallel data corresponding to the set of parallel data lanes 0, 1 to X, respectively. The set of receiving flip-flops RX FF_0, RX FF_1 to RX_X receive the data via a set of receive amplifiers RX0, RX1 to RXX, respectively. The set of receiving flip-flops RX FF_0, RX FF_1 to RX_X include clock inputs (CLK) for receiving a clock signal for clocking received parallel data to the respective outputs (Q) of the flip-flops RX FF_0, RX FF_1 to RX_X.

The transmitting device further includes a transmit amplifier TXC for transmitting a clock signal (e.g., that is used to clock the transmitting flip-flops TX FF_0, TX FF_1 to TX_X) to the receiving device via a corresponding channel CHC. The receiving device includes a receiving amplifier RXC for receiving the clock signal from the transmitting device via the channel CHC.

The receiving device further includes a data signal phase adjustment circuit 610 configured to set a triggering edge (e.g., rising edge) of the clock signal (received from the transmitting device) to coincide with a center of each data eye or valid data region of the parallel data at the data inputs (D) of the receiving flip-flops RX FF_0, RX FF_1 to RX_X. The data signal phase adjustment circuit 610 includes a delay setting controller 612 configured to receive the output data from the outputs (Q) of the receiving flip-flops RX FF_0, RX FF_1 to RX_X. The delay setting controller 612 is configured to generate the control signals DL SET 0, DL SET 1 to DL SET X for setting the individual delays for the variable delay elements DL0, DL1 to DLX at the transmitting device. Although not shown, a communication channel exists for communicating the control signals DL SET 0, DL SET 1 to DL SET X from the transmitting device to the receiving device.

Figure 7:
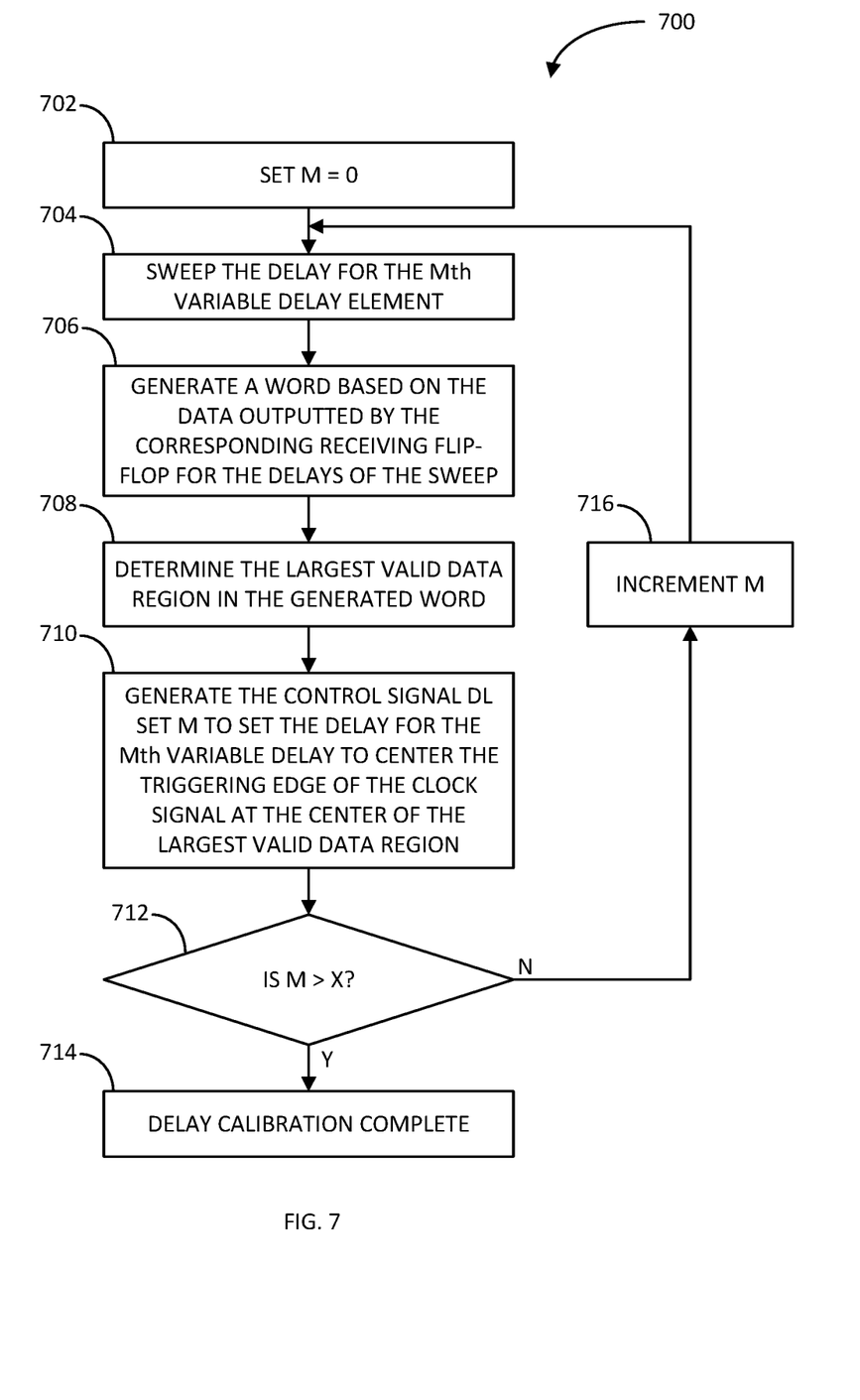
FIG. 7 illustrates a flow diagram of an exemplary method of setting a timing of a triggering edge of a clock signal with respective to a set of received parallel data in accordance with another aspect of the disclosure.

FIG. 7 illustrates a flow diagram of an exemplary method 700 of setting a triggering edge of the received clock signal to coincide with substantially a center of a valid data region of each of the received parallel data in accordance with another aspect of the disclosure. The method 700 may be implemented by the delay setting controller 612 present at the receiving device. A particular pattern, such as alternating ones (1s) and zero(s), may be applied to each data input (D) of the transmitting flip-flops TX FF_0 to TX_FFX.

According to the method 700, the delay setting controller 612 may initialize a variable M to zero (0) (block 702). The variable M represents the variable delay element DLM at the transmitting device that is to be calibrated per the current calibration cycle. Since M has been initialized to zero (0), variable delay element DL0 is to be calibrated per the current calibration cycle.

Then, according to the method 700, the delay setting controller 612 sends an instruction per control signal DL SET 0 to cause the data delay controller 0 to sweep the delay of the variable delay element DL0 in steps (block 704). The set of delays according to the sweep may monotonically change (e.g., increment or decrement) per step.

In block 706, in accordance with the method 700, the delay setting controller 612 receives the data at the output (Q) of receiving flip-flop RX FF_0 for each of the monotonically changing delays applied by the variable delay element DL0 in accordance with the delay sweep, and generates a word based on the received data (block 706). The generated word may include a valid data region of consecutive ones (1s), a transition period consisting of one or more toggling ones (1s) and zeros (0s), and another valid data region of consecutive zeros (0s).

Then, according to the method 700, the delay setting controller 612 determines the largest valid data region in the generated word (block 708). Based on the largest valid data region, the delay setting controller 612 generates the control signal DL SET 0 to set the delay of the variable delay element DL0 so that the triggering edge of the clock signal applied to the clock input (CLK) of the receiving flip-flop RX FF_0 substantially coincides with the center of the largest valid data region of the data applied to the data input (D) of the receiving flip-flop RX FF_0 (block 710).

Then, according to the method 700, the delay setting controller 612 determines whether the variable M is greater than X (block 712). This operation is performed to determine whether all of the variable delay elements DL0, DL1 to DLX have been calibrated. For example, if this is the first calibration cycle where M is equal to zero (0), and X is greater than zero (0), then the delay setting controller 612 increments M per block 716, and proceeds to block 704 to execute the delay calibration cycle for the next variable delay element (e.g., DL1). If, in block 712, the delay setting controller 612 determines that the variable M is greater than X (meaning all of the variable delay elements DL0, DL1 to DLX have been calibrated), the delay setting controller determines that the delay calibration is complete (block 714).

Figure 8:
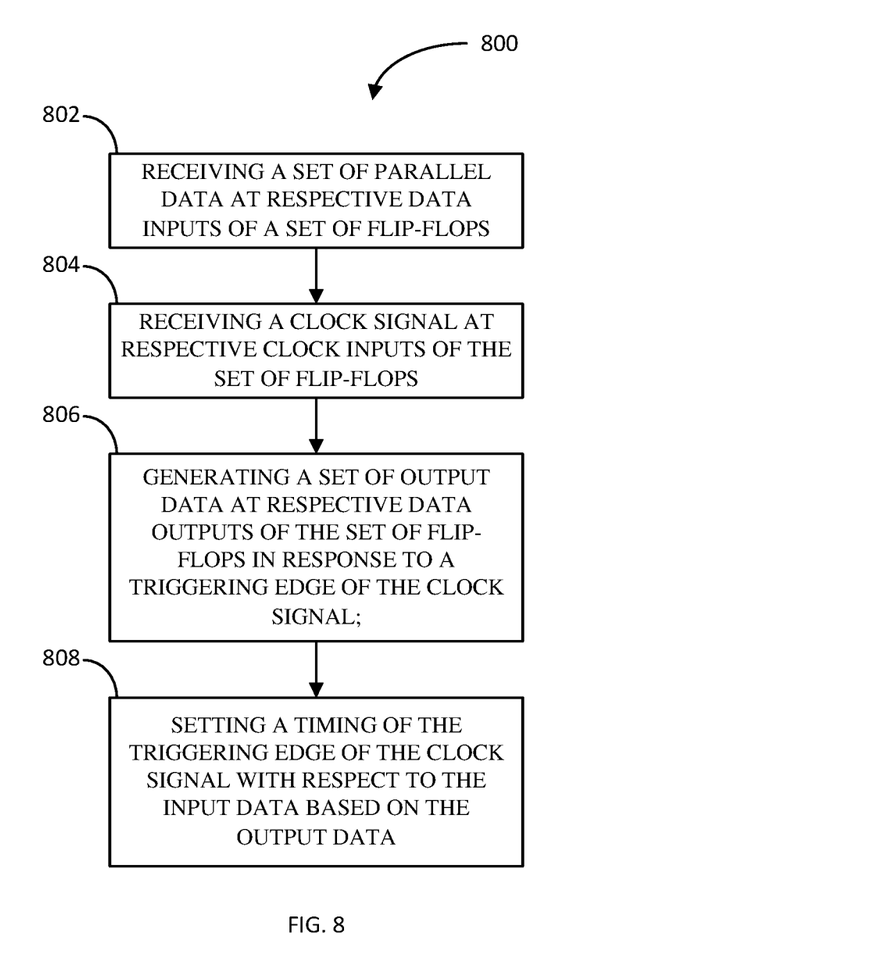
FIG. 8 illustrates a flow diagram of another exemplary method of setting a timing of a triggering edge of a clock signal with respective to a set of received parallel data in accordance with another aspect of the disclosure.

FIG. 8 illustrates a flow diagram of an exemplary method 800 of setting a timing of a triggering edge of a clock signal with respective to a set of received parallel data in accordance with another aspect of the disclosure.

The method 800 includes receiving a set of parallel data at respective data inputs of a set of flip-flops (block 802). An example of a means for receiving a set of parallel data at respective data inputs of a set of flip-flops include the data inputs (D) of the receiving flip-flops RX FF_0 to RX_FF_X of receiving device of the digital interface 100.

The method 800 further includes receiving a clock signal at respective clock inputs of the set of flip-flops (block 804). An example of a means for receiving a clock signal at respective clock inputs of the set of flip-flops include the clock inputs (CLK) of the receiving flip-flops RX FF_0 to RX_FF_X of receiving device of the digital interface 100.

The method 800 also includes generating a set of output data at respective data outputs of the set of flip-flops in response to a triggering edge of the clock signal (806). An example of a means for generating a set of output data at respective data outputs of the set of flip-flops in response to a triggering edge of the clock signal include the receiving flip-flops RX FF_0 to RX_FF_X of receiving device of the digital interface 100.

Additionally, the method 800 includes setting a timing of the triggering edge of the clock signal with respect to the input data based on the output data (block 808). An example of a means for setting a timing of the triggering edge of the clock signal with respect to the input data based on the output data include the clock delay controller 112 of receiving device of the digital interface 100.

Figure 9:
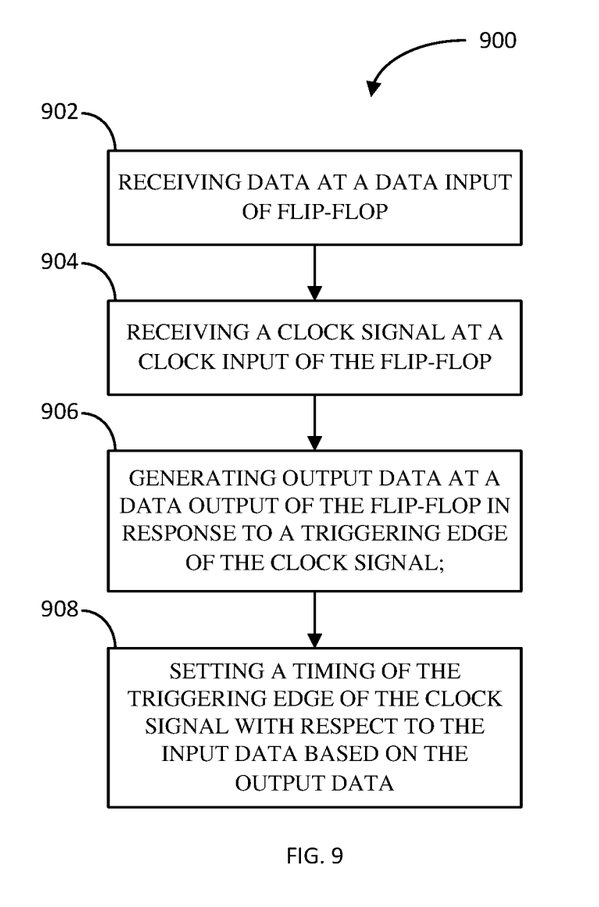
FIG. 9 illustrates a flow diagram of yet another exemplary method of setting a timing of a triggering edge of a clock signal with respective to a received data in accordance with another aspect of the disclosure.

FIG. 9 illustrates a flow diagram of an exemplary method 900 of setting a timing of a triggering edge of a clock signal with respective to a received data in accordance with another aspect of the disclosure.

The method 900 includes receiving data at a data input of a flip-flop (block 902). An example of a means for receiving data at a data input of a set of flip-flops include the data input (D) of any of the receiving flip-flops RX FF_0 to RX_FF_X of receiving device of the digital interface 600.

The method 900 further includes receiving a clock signal at a clock input of the flip-flop (block 904). An example of a means for receiving clock signal at a clock input of the flip-flop include the clock input (CLK) of any of the receiving flip-flops RX FF_0 to RX_FF_X of receiving device of the digital interface 600.

The method 900 also includes generating an output data at a data output of the flip-flop in response to a triggering edge of the clock signal (block 906). An example of a means for generating an output data at a data output of the flip-flop in response to a triggering edge of the clock signal include any of the receiving flip-flops RX FF_0 to RX_FF_X of receiving device of the digital interface 600.

Additionally, the method 900 includes setting a timing of the triggering edge of the clock signal with respect to the input data based on the output data (block 908). An example of a means for setting a timing of the triggering edge of the clock signal with respect to the input data based on the output data include the delay setting controller 612 of receiving device of the digital interface 600.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a set of flip-flops including data inputs, clock inputs, and data outputs, respectively, wherein the set of flip-flops are configured to generate a set of output data at the data outputs based on a set of input data applied to the data inputs in response to a triggering edge of a delayed clock signal commonly applied to the clock inputs, respectively;
a variable delay element configured to apply a calibrated delay to a clock signal to generate the calibrated clock signal; and
a controller configured to generate a control signal for the variable delay element to apply the calibrated delay to the clock signal based on the set of output data generated at the data outputs of the flip-flops, respectively.

2. The apparatus of claim 1, wherein the controller is configured to generate the control signal such that the triggering edge of the delayed clock signal at the clock inputs substantially coincides with a collective valid data region of the set of input data at the data inputs of the flip-flops.

3. The apparatus of claim 1, wherein the controller is configured to generate the control signal such that the triggering edge of the delayed clock signal at the clock inputs coincides substantially with a center of a collective valid data region of the set of input data at the data inputs of the flip-flops.

4. An apparatus, comprising:
a set of flip-flops including data inputs, clock inputs, and data outputs, respectively, wherein the set of flip-flops are configured to generate a set of output data at the data outputs based on a set of input data applied to the data inputs in response to a triggering edge of a clock signal applied to the clock inputs, respectively;
a variable delay element configured to apply a calibrated delay to the clock signal; and
a controller configured to generate a control signal for the variable delay element to apply the calibrated delay to the clock signal based on the set of output data generated at the data outputs of the flip-flops, respectively, wherein the controller is configured to generate the control signal by at least:
controlling the variable delay element to apply a set of monotonically changing delays to the clock signal;
receiving the set of output data from the data outputs of the set of flip-flops for each delay of the set of monotonically changing delays;
assigning a first value in response to each set of output data being all logic zeros;
assigning a second value in response to each set of output data being all logic ones;
assigning a third value in response to each set of output data being a mix of logic ones and logic zeros;
generating an array comprising a set of values based on the first, second, and third values; and
generating the control signal based on the array.

5. The apparatus of claim 4, wherein the set of values of the array correspond with the set of monotonically changing delays of the variable delay element, respectively.

6. The apparatus of claim 5, wherein the controller is configured to generate the control signal such that the calibrated delay corresponds to one of the set of monotonically changing delays that corresponds to one of a consecutive string of first values or second values of the array.

7. The apparatus of claim 5, wherein the controller is configured to generate the control signal such that the calibrated delay corresponds to one of the set of monotonically changing delays that corresponds to substantially a center of a consecutive string of first values or second values of the array.

8. The apparatus of claim 7, wherein the consecutive string of first values or second values is the longest consecutive strings of the same values of the array.

9. A method, comprising:
receiving a set of input data at respective data inputs of a set of flip-flops;
receiving a clock signal at respective clock inputs of the set of flip-flops;
generating a set of output data at respective data outputs of the set of flip-flops in response to a triggering edge of the clock signal; and
setting a timing of the triggering edge of the clock signal with respect to the input data based on the output data, wherein setting the timing of the triggering edge of the clock signal comprises:
applying a set of monotonically changing delays to the timing of the triggering edge of the clock signal with respect to the input data at the respective data inputs of the flip-flops;
receiving the set of output data from the data outputs of the set of flip-flops for each delay of the timing of the triggering edge;
assigning a first value in response to each set of output data being all logic zeros;

assigning a second value in response to each set of output data being all logic ones;

assigning a third value in response to each set of output data being a mix of logic ones and logic zeros;

generating an array comprising a set of values based on the first, second, and third values; and generating the control signal based on the array.

10. The method of claim 9, wherein the set of values of the array correspond with the set of monotonically changing delays of the variable delay element, respectively.

11. The method of claim 10, wherein setting the timing of the triggering edge of the clock signal comprises selecting one of the set of monotonically changing delays that corresponds to one of a consecutive string of first values or second values of the array.

12. The method of claim 10, wherein setting the timing of the triggering edge of the clock signal comprises selecting one of the set of monotonically changing delays that corresponds to substantially a center of a consecutive string of first values or second values of the array.

13. The method of claim 12, wherein the consecutive string of first values or second values is the longest consecutive strings of the same values of the array.

14. An apparatus, comprising:

means for receiving a set of input data at respective data inputs of a set of flip-flops;

means for receiving a clock signal at respective clock inputs of the set of flip-flops;

means for generating a set of output data at respective data outputs of the set of flip-flops in response to a triggering edge of the clock signal; and means for setting a timing of the triggering edge of the clock signal with respect to the input data based on the output data, wherein the means for setting the timing of the triggering edge of the clock signal comprises:

means for applying a set of monotonically changing delays to the timing of the triggering edge of the clock signal with respect to the input data at the respective data inputs of the flip-flops;

means for receiving the set of output data from the data outputs of the set of flip-flops for each delay of the timing of the triggering edge;

means for assigning a first value in response to each set of output data being all logic zeros;

means for assigning a second value in response to each set of output data being all logic ones;

means for assigning a third value in response to each set of output data being a mix of logic ones and logic zeros;

means for generating an array comprising a set of values based on the first, second, and third values; and means for generating the control signal based on the array.

15. The apparatus of claim 14, wherein the set of values of the array corresponds with the set of monotonically changing delays of the variable delay element, respectively.

16. The apparatus of claim 15, wherein the means for setting the timing of the triggering edge of the clock signal comprises means for selecting one of the set of monotonically changing delays that corresponds to one of a consecutive string of first values or second values of the array.

17. The apparatus of claim 15, wherein the means for setting the timing of the triggering edge of the clock signal comprises means for selecting one of the set of monotonically changing delays that corresponds to substantially a center of a consecutive string of first values or second values of the array.

18. The apparatus of claim 17, wherein the consecutive string of first values or second values is the longest consecutive strings of the same values of the array.

19. An apparatus, comprising:

a flip-flop including a data input, a clock input, and a data output, wherein the flip-flop is configured to generate an output data at the data output based on an input data applied to the data input in response to a triggering edge of a clock signal applied to the clock input;

a variable delay element configured to apply a calibrated delay to the input data signal; and a controller configured to generate a control signal for the variable delay element to apply the calibrated delay to the input data based on the output data generated at the data output of the flip-flop, wherein the controller is configured to generate the control signal by at least:

controlling the variable delay element to apply a set of monotonically changing delays to the data signal;

receiving the output data from the data output of the flip-flop for each delay of the set of monotonically changing delays;

generating a word comprising a set of the output data corresponding to the set of the monotonically changing delays of the data signal, respectively; and generating the control signal based on the word.

20. The apparatus of claim 19, wherein the controller is configured to generate the control signal such that the triggering edge of the clock signal at the clock input substantially coincides with a valid data region of the input data at the data input of the flip-flop.

21. The apparatus of claim 19, wherein the controller is configured to generate the control signal such that the calibrated delay corresponds to one of the set of monotonically changing delays that corresponds to one of a consecutive string of logic ones or logic zeros of the word.

22. The apparatus of claim 19, wherein the controller is configured to generate the control signal such that the calibrated delay corresponds to one of the set of monotonically changing delays that corresponds to substantially a center of a consecutive string of logic ones or logic zeros of the word.

23. An apparatus, comprising:

a flip-flop including a data input, a clock input, and a data output, wherein the flip-flop is configured to generate an output data at the data output based on an input data applied to the data input in response to a triggering edge of a clock signal applied to the clock input;

a variable delay element configured to apply a calibrated delay to the input data signal;

a controller configured to generate a control signal for the variable delay element to apply the calibrated delay to the input data based on the output data generated at the data output of the flip-flop;

a transmitting device configured to generate and transmit the input data, wherein the transmitting device comprises the variable delay element; and a receiving device configured to receive the input data from the transmitting device, wherein the receiving device comprises the flip-flop and the controller.

* * * * *